United States Patent [19]
Parise

[11] Patent Number: 6,162,985
[45] Date of Patent: Dec. 19, 2000

[54] NIGHTTIME SOLAR CELL

[76] Inventor: Ronald J. Parise, 101 Wendover Rd., Suffield, Conn. 06078

[21] Appl. No.: 09/359,108

[22] Filed: Jul. 22, 1999

Related U.S. Application Data

[63] Continuation-in-part of application No. 08/933,789, Sep. 19, 1997, Pat. No. 5,936,193.
[60] Provisional application No. 60/046,027, May 9, 1997.
[51] Int. Cl.[7] .................................................. H01L 35/00
[52] U.S. Cl. ........................ 136/201; 136/205; 136/206; 136/246
[58] Field of Search ................................... 136/201, 205, 136/206, 243, 246

[56] References Cited

U.S. PATENT DOCUMENTS

| | | | |
|---|---|---|---|
| 2,984,696 | 5/1961 | Shaffer | 136/4 |
| 3,523,832 | 8/1970 | Rupprecht et al. | 136/205 |
| 3,549,960 | 12/1970 | Wedlock | 317/235 |
| 3,781,647 | 12/1973 | Glaser | 322/2 |
| 4,002,499 | 1/1977 | Winston | 136/206 |
| 4,003,638 | 1/1977 | Winston | 350/293 |
| 4,032,363 | 6/1977 | Raag | 136/211 |
| 4,088,116 | 5/1978 | Pastor | 136/270 |
| 4,129,115 | 12/1978 | Wyatt | 126/270 |
| 4,188,571 | 2/1980 | Brunson | 322/2 R |
| 4,234,352 | 11/1980 | Swanson | 136/253 |
| 4,292,579 | 9/1981 | Constant | 322/2 R |
| 4,312,330 | 1/1982 | Holdridge | 126/440 |
| 4,320,247 | 3/1982 | Gatos et al. | 136/255 |
| 4,320,248 | 3/1982 | Yamazaki | 136/255 |
| 4,332,973 | 6/1982 | Sater | 136/246 |
| 4,332,974 | 6/1982 | Fraas | 136/249 |
| 4,338,560 | 7/1982 | Lemley | 322/2 A |
| 4,500,741 | 2/1985 | Morimoto et al. | 136/206 |
| 4,667,059 | 5/1987 | Olson | 136/249 |
| 4,710,588 | 12/1987 | Ellion | 136/206 |
| 4,710,589 | 12/1987 | Meyers et al. | 136/258 PC |
| 4,828,628 | 5/1989 | Hezel et al. | 136/255 |
| 5,006,178 | 4/1991 | Bijvoets | 136/211 |
| 5,116,427 | 5/1992 | Fan et al. | 136/259 |
| 5,385,615 | 1/1995 | Horne | 136/246 |
| 5,403,404 | 4/1995 | Arya et al. | 136/249 |
| 5,439,533 | 8/1995 | Saito et al. | 136/258 |
| 5,522,944 | 6/1996 | Elazari | 136/248 |
| 5,616,185 | 4/1997 | Kukulka | 136/244 |

*Primary Examiner*—Kathryn Gorgos
*Assistant Examiner*—Thomas H Parsons
*Attorney, Agent, or Firm*—Cantor Colburn LLP

[57] ABSTRACT

This invention is a thermoelectric-photovoltaic device for converting electrical energy from both thermal radiation and sunlight. Thermoelectric energy is produced from thermoelectric cells when a temperature difference is present between two different semiconductor materials. Photovoltaic energy is produced from photovoltaic cells when two different semiconductor materials are exposed to sunlight. To achieve increased electrical energy production, one of the semiconductor materials is placed in a cell having a reduced pressure atmosphere to increase the radiative energy thermal exchange with the black sky at night.

98 Claims, 9 Drawing Sheets

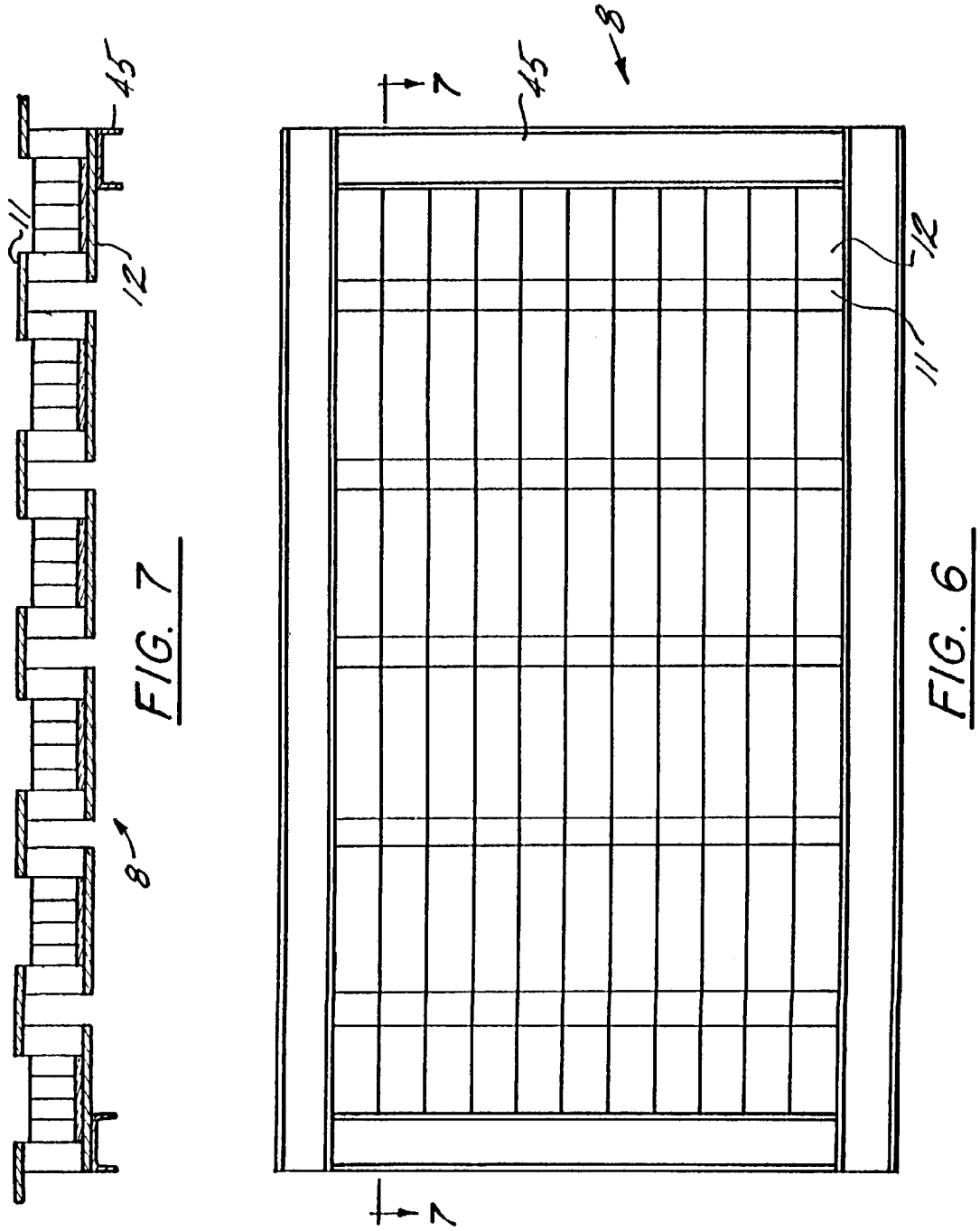

NIGHTTIME SOLAR CELL

CROSS-REFERENCE TO RELATED APPLICATIONS

This application is a continuation-in-part application of U.S. patent application Ser. No. 08/933,789, filed Sep. 19, 1997 now U.S. Pat. No. 5,936,193, which further claims the benefit of U.S. Provisional Application Serial No. 60/046,027 filed May 9, 1997, both of which are hereby incorporated by reference.

BACKGROUND OF INVENTION

1. Field of the Invention

The present invention relates generally to the use of solar and thermal energy and more particularly to the conversion of solar and thermal energy to electrical energy.

2. Description of the Related Art

The conversion of solar energy to electrical energy through the use of photovoltaic cells is well established in the art. Photovoltaic cells are semiconductor components that convert light into useable electrical energy. A typical photovoltaic cell, commonly referred to as a solar cell, is comprised of an interface between an n-type semiconductor material and a p-type semiconductor material. A thin transparent layer of n-type or p-type material is deposited on a p-type or n-type material respectively to form an active p-n or n-p junction. When the junction is exposed to visible or nearly visible light, in a solar cell application, electron hole pairs, or minority charge carriers, are created at the junction. The minority charge carriers at the n-p interface migrate across the junction in opposite directions producing an electrical potential or an electrical voltage difference. In solar cell applications, electrical contacts, sometimes called ohmic contacts, are connected to the n-type and p-type materials on either side of the junction and an ensuing electric current is obtained.

The prior art has disclosed many variations of the basic p-n junction interface. Many of these variations have been attempts to improve the efficiency and effectiveness of the solar cell at absorbing solar energy. For example, a heterojunction photovoltaic device is comprised of stacked p-n junctions of different materials with band gap energies that match different parts of the solar spectrum. U.S. Pat. No. 4,332,974 discloses a multi layer photovoltaic cell wherein the first p-n layer will absorb energy in a particular band of the spectrum while the remaining energy passes through to the next p-n layer. The next subsequent p-n layer in the stack is comprised of materials that absorb a different band of the spectrum from the preceding layer. Each preceding layer acts as a window to the remaining energy of the spectrum that it does not absorb. With the cells arranged in such a fashion, the amount of solar energy converted to electrical energy is expanded, thus increasing the efficiency of the device.

Another example of a prior art variation of the basic p-n junction is the p-I-n junction. The p-I-n junction is comprised of p-type semiconductor material and n-type semiconductor material separated by an intrinsic-type semiconductor material. The addition of the intrinsic-type material layer creates a diffusion potential between this layer and the p-type material and the n-type material. The p-I-n device is constructed such that the majority of the incident light energy is absorbed in the intrinsic layer allowing more of the positive and negative charge carriers to diffuse toward their respective p-type and n-type interfaces. This variation on the basic p-n junction enhances the flow of the charge carriers and improves the overall efficiency and effectiveness of the photovoltaic cell.

Typically, the individual interfaces of photovoltaic cells are interconnected to form an array or panel to supply electrical power. Regardless of the type of junction, the photovoltaic cells and the resulting arrays are subsequently interconnected in series/parallel connections to supply the required voltage and current output.

There are many cases of prior art wherein photovoltaic cells are enhanced to increase efficiency of a solar panel. For example, U.S. Pat. Nos. 4,002,499, 4,003,638, 4,088,116, 4,129,115, and 4,312,330 all disclose various methods of concentrating the incident light energy entering a photovoltaic cell. The common theme among the above cited examples is the use of a reflective device to collect sunlight distributed over a larger area and focus it upon a photovoltaic cell thereby increasing the amount of incident light energy.

The use of solar panels to convert light energy into thermal energy is also well known in the art. There are many examples of prior art which utilize light energy to passively heat fluid. For instance, U.S. Pat. No. 5,522,944 discloses the use of interconnected tubes disposed within an array of photovoltaic cells for converting solar energy to thermal energy in a fluid disposed within the tubes.

Likewise, the use of a thermoelectric generator to convert thermal energy into electric energy is well known in the art. Thermoelectric generators are semiconductor or solid state devices which convert thermal energy to electrical energy directly. Unlike photovoltaic cells however they are restricted to a maximum possible thermal efficiency of $1-(T_L/T_H)$. This relationship is referred to as the Carnot efficiency and is calculated at the operating temperature between the source temperature, $T_H$, and the sink temperature, $T_L$.

Thermoelectric generators can be analyzed by using simple thermodynamic relationships at the macroscopic level unlike photovoltaic cells which normally require extensive analysis at the microscopic level. Simple fundamental relationships are utilized in the area of art to aid in understanding the function of the solid state devices employed in thermoelectric generators.

Thermoelectric generators are based on the Seebeck effect which holds that when two dissimilar materials are exposed to a temperature differential an electric current will be generated at their junction. The suitability of the materials for the thermoelectric device depends primarily on a parameter referred to as the figure of merit. The figure of merit is based on the material type evaluated at the perceived operating temperature of the thermoelectric device. The higher the value of the figure of merit in the temperature range of the thermoelectric device the better suited the materials are for a thermoelectric device. It is well known in the art to optimize the figure of merit for candidate materials by optimizing material geometries along with material types. In order to optimize the figure of merit an area ratio between the n-type and the p-type materials is selected such that the following relationships are satisfied:

$$\frac{A_n}{A_p} = [\rho_n \lambda_p / \rho_p \lambda_n]^{\frac{1}{2}}$$

and $$1_n = 1_p$$

where
- $A_n$ area of n-type material
- $A_p$ area of p-type material
- $\rho_p$, $\rho_n$ electrical resistivity
- $\lambda_p$, $\lambda_n$ thermal conductivity
- $1_p$, $1_n$ Length of area elements.

With the semiconductor materials selected based on the above equations, the figure of merit, Z, is optimized by satisfying the following relationship:
where $$Z = \frac{(|\alpha_p| + |\alpha_n|)^2}{\left[(\rho_n \lambda_n)^{\frac{1}{2}} + (\rho_p \lambda_p)^{\frac{1}{2}}\right]^2}$$

$\alpha_p$, $\alpha_n$ Seebeck coefficients.

For the optimum figure of merit, Z, the optimum current, $I_{opt}$, produced by the thermoelectric generator is calculated by the following equation:

$$I_{opt} = \frac{(|\alpha_p| + |\alpha_n|)(T_H - T_L)}{R[\chi + 1]}$$

where $$R = \frac{\rho_n 1_n}{A_n} + \frac{\rho_p 1_p}{A_p}$$

and
$T_H$, $T_L$ are the high and low temperatures of the source and the sink, respectively.
and $$\chi = [1 + Z((T_H + T_L)/2)]^{1/2}$$

The open circuit voltage for the thermoelectric generator, $V_{oc}$, is calculated by the following equation:

$$V_{oc} = (|\alpha_p| + |\alpha_n|)(T_H - T_L)$$

The specific thermal efficiency of the thermoelectric generator for the optimized conditions then becomes:

$$\eta_{th} = \left[1 - \frac{T_L}{T_H}\right](\chi - 1)/(X + (T_L/T_H))$$

Note that it is not possible for the thermoelectric generator to have a thermal efficiency greater than the previously stated Carnot efficiency and as such $T_L/T_H$ at the operating conditions of the device must be less than one.

An example of a thermoelectric generator is disclosed in U.S. Pat. No. 4,338,560. The thermoelectric generator of the '560 patent discloses a generator that comprises an array of sources and sinks interconnected by n-type and p-type doped material elements. It is disclosed that the sources absorb infrared heat from the earth and the sinks emit excess heat to space.

State of the art photovoltaic cells work well during daylight hours or when there is a sufficient incident light source, while thermoelectric generators tend to work better at night. What is needed is a thermoelectric-photovoltaic cell system with both enhanced terrestrial and space capabilities which employs state of the art design and manufacturing techniques to obtain maximum electrical energy output from the solar cells during daylight and sunlight conditions and from thermoelectric generator cells from temperature differentials.

SUMMARY OF THE INVENTION

The above-discussed and other drawbacks and deficiencies of the prior art are overcome or alleviated by the energy generating device and method of the present invention. The electricity generating device uses an electricity generating cell comprising: a first junction surface disposed in contact with a first semiconductor material; a second junction surface disposed in contact with a second semiconductor material; a third junction surface disposed in contact with the first semiconductor material and the second semiconductor material; the first and second junction surfaces disposed within a pressure cell having a pressure less than the ambient pressure; and the first and second junction surfaces at a temperature different from the third junction surface producing a thermoelectric potential between the first and second junction surfaces.

The method of converting thermal radiation and sunlight into electrical energy of the present invention, comprising: forming the device by electrically connecting, in a parallel fashion, at least one thermoelectric cell with at least one photovoltaic cell; orienting the device such that the thermoelectric cell and the photovoltaic cell are in a perpendicular arrangement with the sunlight throughout the orbit; producing electrical energy from both the photovoltaic cell and the thermoelectric cell in the full sunlight exposure position; and producing energy from the thermoelectric cell in the full shade position.

The above-discussed and other features and advantages of the present invention will be appreciated and understood by those skilled in the art from the following detailed description and drawings.

BRIEF DESCRIPTION OF THE DRAWINGS

Referring now to the drawings wherein like elements are numbered alike in the several Figures:

FIG. 6 is a plan view of an array panel and support structure incorporating a thermoelectric-photovoltaic cell of the present invention.

FIG. 7 is a cross sectional view of an array panel and support structure incorporating a thermoelectric-photovoltaic cell of the present invention.

DETAILED DESCRIPTION OF THE DRAWINGS

Figure 1:
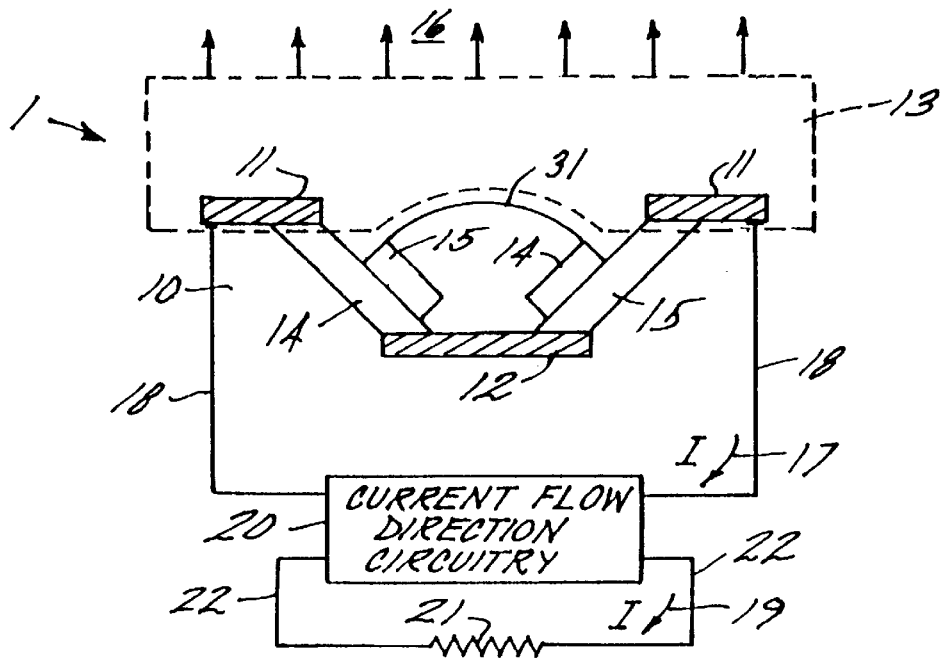
FIG. 1 is a schematic representation of a thermoelectric-photovoltaic cell of the present invention.

An embodiment of the nighttime solar cell of the present invention is shown schematically in FIG. 1. The nighttime solar cell 1 of the present invention includes a thermoelectric generator 10, current flow circuitry 20, and a current load 21. The generator is comprised of a junction surface 11, a junction surface 12, a reduced pressure cell 13, n-type doped material 14, and p-type doped material 15. The schematic presented in FIG. 1 depicts the operation of the present invention in a nighttime terrestrial embodiment. The junction surface 11 emits thermal energy through radiation heat transfer 16 to the black sky at night. In this embodiment junction surface 11 becomes a cold temperature sink for the thermoelectric generator 10 preferably having an emissivity greater than 0.90, with about 0.96 to about 0.99 especially preferred. The black sky has an effective temperature around zero degrees absolute temperature which allows the cold temperature sink to radiate heat to the black sky via electromagnetic energy. In a terrestrial embodiment of the present invention the junction surface 12 is the hot temperature source as it is exposed to ambient temperature, typically about 200° K to 325° K, with about 220° K to 310° K more common. The temperature difference that exists between the junction surfaces produces an electrical current 17 in the p-type material and the n-type material of the thermoelectric generator.

The present invention utilizes reduced pressure cell 13, 13', 13" (see FIGS. 9, 10, and 11) to take advantage of the extremely low temperatures of the black sky. The reduced pressure cell can encapsulate the junction surface 11, encapsulate the thermoelectric generator 10 except for junction surface 12, or can encapsulate the entire thermoelectric generator, to insulate the junction surface 11 or the thermoelectric generator 10 from the ambient temperatures. The pressure within the reduced pressure cell 13 is a pressure lower than the ambient pressure, with the ideal pressure of the reduced pressure cell 13 being a perfect vacuum. The reduced pressure cell 13 is manufactured from a material suitable to allow junction surfaces 11 to "see" the black sky and exchange energy with it by radiation heat transfer.

Figure 9:
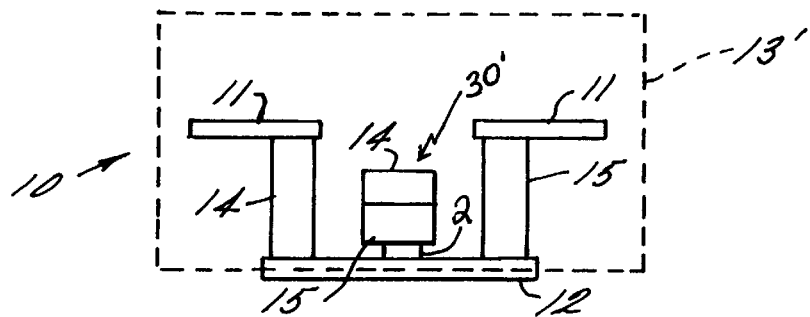
FIG. 9 is a cross sectional view of a thermoelectric-photovoltaic cell of the present invention.
Figure 10:
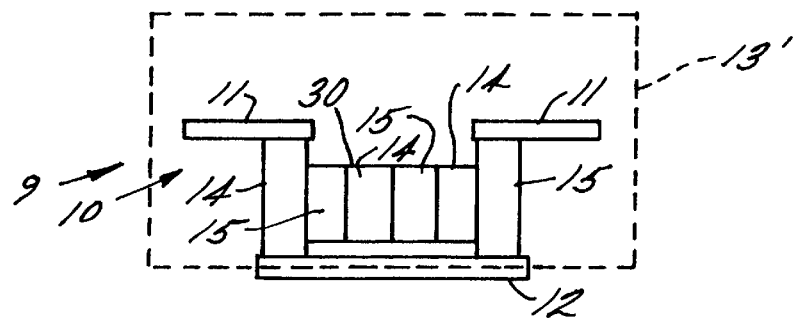
FIG. 10 is a cross sectional view of a thermoelectric-photovoltaic cell of the present invention.

In one embodiment, referring to FIGS. 9 and 10, the reduced pressure cell 13' (also known as the vacuum cell or vacuum pod), encapsulates the photovoltaic cell 30 and the majority of the thermoelectric generator 10, leaving junction surface 12 thermally connected to the environment and allowing the establishment of conductive heat transfer with the surroundings. Utilizing the reduced pressure cell 13' in this fashion enables the elimination of the insulation 40 (see FIGS. 3 and 4), thereby reducing the overall system weight and cost, while providing a more effective insulation of the photovoltaic cells and allowing the thermoelectric generator to operate at a higher daytime temperature to improve its performance.

Figure 11:
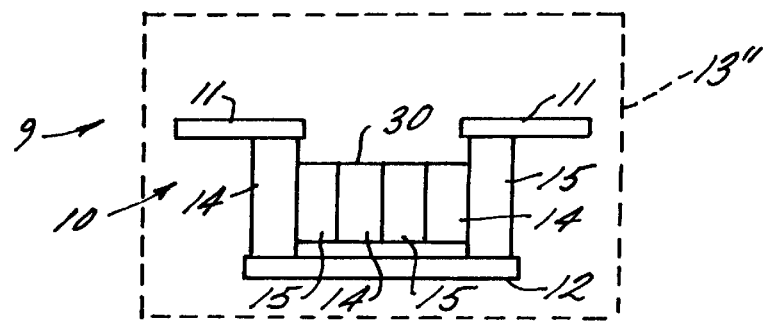
FIG. 11 is a cross sectional view of a thermoelectric-photovoltaic cell of the present invention.

In another embodiment, set forth in FIG. 11, the reduced pressure cell 13" fully encapsulates the thermoelectric generator 10 and photovoltaic cell 30. In this embodiment, junction surface 12 thermally connects to the environment via radiative heat transfer only. This thermal connectivity enables the amount of heat provided to the thermoelectric generator 10 during nighttime usage or removed therefrom during daytime usage, to be controlled, particularly in extreme temperature conditions.

Figure 12:
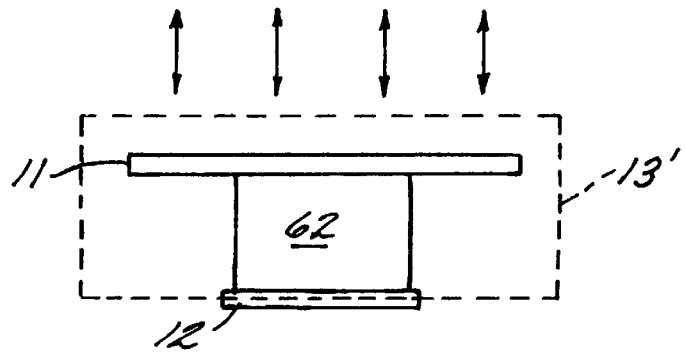
FIG. 12 is a cross sectional view of a thermoelectric generator of the present invention where the junction surface area is varied to improve performance.
Figure 21:
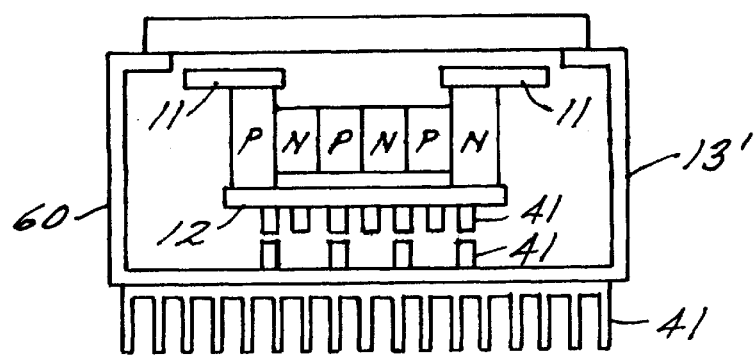
FIG. 21 is a cross sectional view of a cell of the present invention which employs both internal and external heat transfer augmentation.

In FIG. 12, the reduced pressure cell 13' (as shown in FIGS. 9 and 10) further comprises an aperture or window 60 (as shown in FIG. 21). This enables the junction surface 11 usage to also serve as a sink during daytime usage. If the thermoelectric generator 10 uses the daytime sky as a sink (normally shielded from the direct rays of the sun) then junction surface 11 is a sink in daylight usage and junction surface 12 is the source. FIG. 21 further illustrates the window which forms the aperture 60 of the reduced pressure cell 13' to exchange radiative energy with a radiative source or sink. The radiative exchange area in the cell prefers line-of-sight contact with the sink (or source) energy exchange external body only, and hopefully no other bodies that will detrimentally influence the energy exchange. The size of the aperture can be larger, smaller, or substantially equivalent to the size of the radiative heat transfer area, with a size which maximizes the effectiveness of the radiative heat transfer area preferred.

To improve the radiative characteristics of the energy exchange, spectral transmitting characteristics of the window with the external body can be chosen accordingly. For example, when deep space is used as a sink, deep space at approximately 4° K is always visible to terrestrial objects in certain band widths. Rain, snow, clouds, etc., notwithstanding, there is always an energy exchange. Window optical properties will be selected to optimize this energy exchange. Coatings may also be applied to the window to augment or improve its energy transmitting capabilities. The internal surface of the window can be coated to maximize transmission from the radiative heat transfer area while minimizing the internal reflectivity. Also, when exclusively using thermoelectric generators and deep space as a sink, the external window surface may be coated with coatings that affect maximum reflectivity of all energy, with minimum transmission inward.

Alternatively, if the daytime usage will be exclusively thermoelectric generator elements that utilize the sun as a thermal source, then maximum transmissivity is desired through the external surface of the window. The optical properties of the window and the surface coatings would preferably effect this result, with radiative energy bandwidths maximized.

In an alternative embodiment employing the thermoelectric generators and the photovoltaic cells in parallel arrangement exposed to the external surroundings of the window, the coatings which maximize the transmissivity of the energy needed to heat the hot junction of the thermoelectric generator elements is preferred. These coatings should also allow the transmittance of the solar radiation that excites the electrons in the photovoltaic cells into the conduction band to increase electron activity and improve electrical power generation.

It should be noted that if the daytime usage will be exclusively employing thermoelectric generator units which will utilize the sun as a thermal source, then maximum transmissivity in the solar thermal range (blocking deep space coating) is desired through the external surface of the window into the pod. The optical properties of the window and the surface coatings would effect this result, with appropriate radiative energy bandwidths maximized.

The appropriate coating to be applied to the interior and/or exterior surface of the window can readily be determined by an artisan, with coatings which would allow transmissivity for the atmosphere of about 8 μm to about 13 μm, preferred.

The electric circuit of an embodiment of the nighttime solar cell is also shown in FIG. 1. During nighttime periods, or periods without incident light, current 17 travels in the direction shown from junction surface 11 to current flow direction circuitry 20 via connection 18. Current flow direction circuitry determines the direction of the incoming current 17, and properly orients the current into outgoing current 19 which is carried via connection 22 where it is stored or consumed by load 21.

Figure 2:
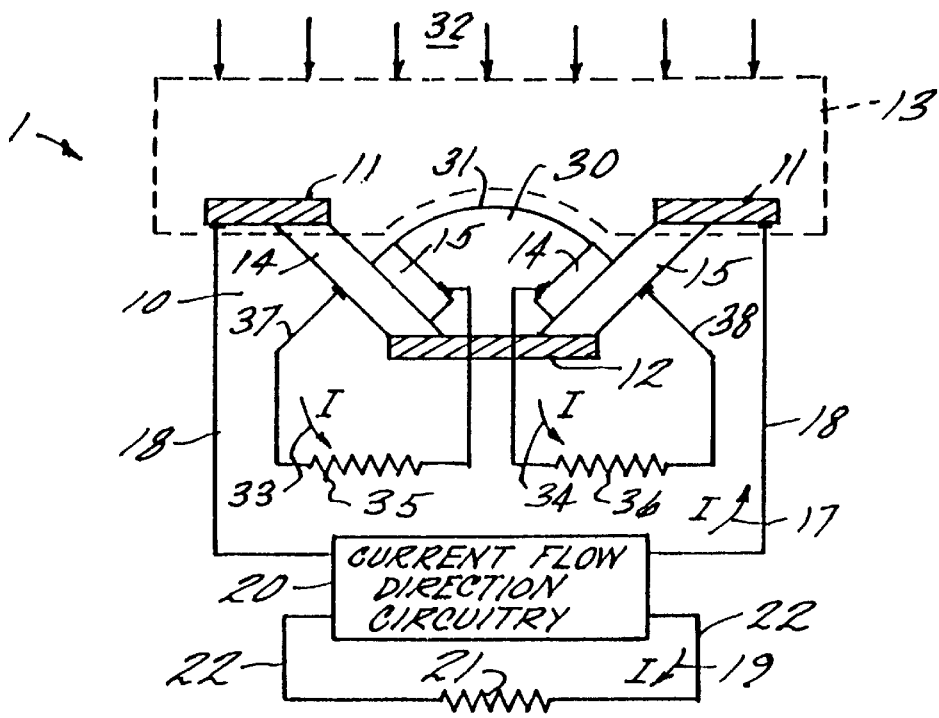
FIG. 2 is a schematic representation of a thermoelectric-photovoltaic cell of the present invention.

Referring next to FIG. 2, there is illustrated a schematic representation of an embodiment of the present invention during daylight operation. In addition to the embodiment previously described the nighttime solar cell illustrated includes a photovoltaic cell 30 comprising concentrating lens 31, n-type doped material 14, and p-type doped material 15. Photovoltaic cell 30 is arranged within thermoelectric generator 10. During daylight operation an embodiment of the present invention produces electrical energy from thermoelectric generator 10 as well as photovoltaic cell 30. Concentrating lens 31 receives solar energy 32 falling between junction surfaces 11 and focuses it upon n-type doped material 14 and p-type doped material 15. Thus configured photovoltaic cell 30 generates current 33, 34 which is carried to load 35, 36 via connections 37, 38.

The operation of a thermoelectric generator during daylight conditions is also illustrated in FIG. 2. During daylight conditions thermoelectric generator 10 functions opposite to that described above for nighttime conditions. Solar energy 32 enters the device and warms junction surfaces 11. The irradiation of solar energy upon junction surface 11 causes the junction surfaces to become the hot junction and the relatively cooler ambient conditions cause junction surface 12 to become the cool junction surface for the thermoelectric generator. In a preferred embodiment, the absorptivity of surface junction 11 is greater than 0.90. In addition, for certain embodiments it is advantageous to select a material for surface junction 11 wherein the emissivity and the absorptivity are nearly equal. Electrical current 17 is generated by the temperature difference between the hot and cold junction surfaces and is opposite in direction to that produced during nighttime operation. Current 17 is carried to current flow direction circuitry 20 wherein its direction is properly oriented into outgoing current 19 and carried to load 21 via connection 22 where it is either stored or consumed.

Alternatively the thermoelectric generator could be solely utilized, even during the day. In this operating mode, during the day, the thermoelectric generator would be shielded from the rays of the sun and allowed to look at deep space. This mode of operation is the same as the nighttime mode of operation, and the current flow direction sensing circuitry is not necessary, but the reduced pressure cell is preferred for improved operation.

Yet another mode of operation would be to expose the radiative heat transfer area to the direct rays of the sun so that it becomes the hot junction for the thermoelectric generators and the ambient environment (or some other sink) becomes the sink temperature for the waste heat. This mode of operation is opposite to the nighttime mode, therefore the current flow direction circuitry is employed.

Although the connections and loads illustrated in FIGS. 1 and 2 are shown as separate they may be combined and interconnected with other such devices as the electrical needs of a particular embodiment dictate. The embodiment shown in FIGS. 1 and 2 may be terrestrial or space based. The important distinguishing characteristic between a terrestrial based application and a space application is the reduced pressure cell. The reduced pressure cell insulates the surface junction of the thermoelectric generator from the earth's ambient surroundings while simultaneously allowing for the surface junction to react radiatively with the sun or the night sky. In space based applications the insulative properties of the reduced pressure cell are not necessary.

Figure 3:
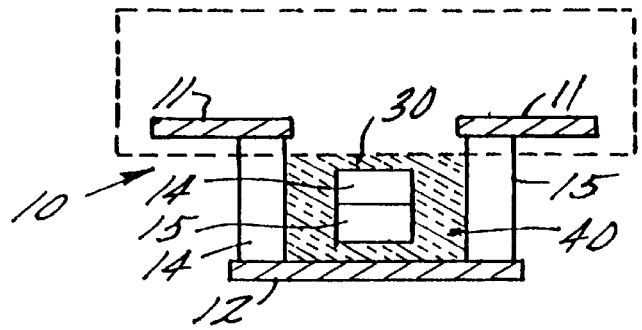
FIG. 3 is a cross sectional view of a thermoelectric-photovoltaic cell of the present invention.

Referring now to FIG. 3 there is illustrated another embodiment of the present invention. This embodiment is configured for terrestrial use and includes, in addition to the embodiments previously described, thermally insulative material 40. Thermally insulative material 40 insulates photovoltaic cell 30 from thermoelectric generator 10. With the two devices thermally insulated the performance of the thermoelectric generator is not influenced by any thermal transfer from the photovoltaic cell, and the overall performance of the nighttime solar cell is enhanced. In addition the photovoltaic cell is not influenced by the thermoelectric generator. The embodiment shown in FIG. 3 may also advantageously include a concentrating lens as previously described.

Figure 4:
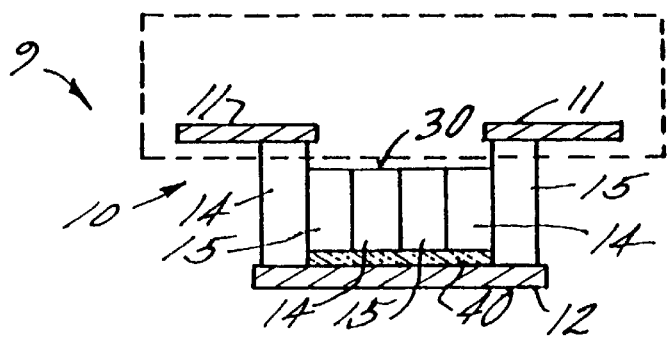
FIG. 4 is a cross sectional view of a thermoelectric-photovoltaic cell of the present invention.

Referring next to FIG. 4 there is illustrated another embodiment of the present invention. In the embodiment illustrated the photovoltaic cell 30 includes n-type 14 and p-type 15 materials connected in series with n-type 14 and p-type 15 materials of the thermoelectric generator 10 to yield a series thermoelectric-photovoltaic device 9. In this particular embodiment the charge carrier collection capability, or the current flow, of the device is greatly improved.

Figure 5:
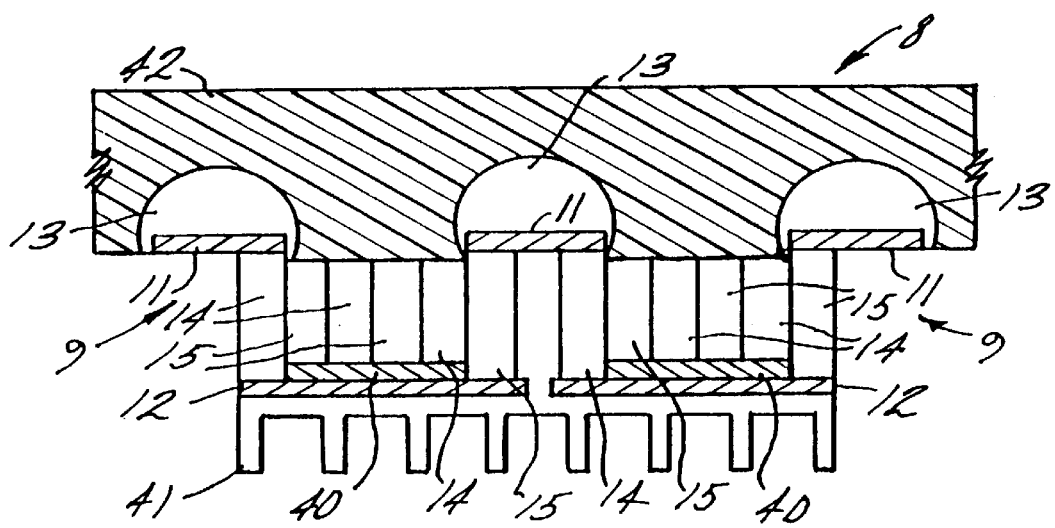
FIG. 5 is a cross sectional view of an array incorporating a thermoelectric-photovoltaic cell of the present invention.

Illustrated in FIG. 5 is still other embodiment of the present invention. The partial array 8 illustrated includes a pair of series thermoelectric-photovoltaic devices, heat transfer fins 41, and encapsulant 42. Heat transfer fins 41 are disposed in heat exchange relationship with junction surfaces 12 and the ambient air. During nighttime operation the heat transfer fins enhance the conduction of heat from the ambient air to the junction surfaces, and during daylight conditions the heat transfer fins improve the transfer of heat from the junction surfaces to the ambient air. Various heat transfer augmentation can be utilized such as forced air, water, another fluid, or a thermal source of waste heat for nighttime operation (e.g., a fluid heat exchanger, baffled heat exchanger, radiation shield, heat transfer composition) and forced air, water, another fluid, or a thermal sink for daytime operation, among others, and combinations thereof. Furthermore, the heat transfer augmentation can be disposed on junction surface 11 and/or 12, external to the cell, or internal to the cell, i.e. in thermal communication with the reduced pressure cell 13, 13', 13", junction surface 11, and/or junction surface 12. Furthermore, the heat transfer augmentation can be used for units that are ganged or assembled in arrays or on panels and includes the use of a forced fluid in a conduit or pipe (e.g., see 41" as shown on FIG. 22) thermally attached to the pod, or of a waste stream that could add or remove energy from the units as required. Encapsulant 42, essentially a cover, is bonded to junction surfaces 11 under reduced pressure conditions to form reduced pressure cells 13.

Figure 13:
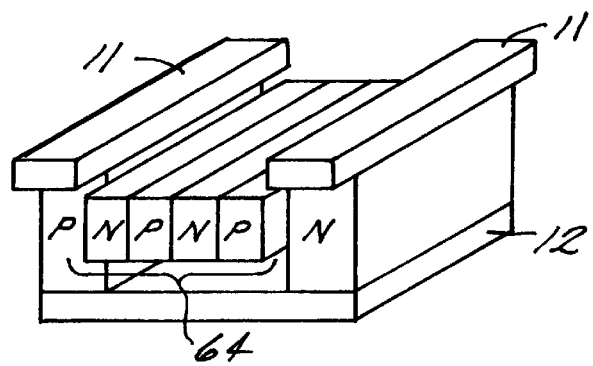
FIG. 13 is an isometric view of a thermoelectric-photovoltaic cell of the present invention where the radiative area is varied as well as the size of the various p-type and n-type materials.

Further embodiments of the present invention are illustrated in FIGS. 12–18 which illustrate some of the possible variations, both relative size and geometry, of the thermal junctions 11, 12 and/or the p-type 15 and n-type 14 materials. In FIG. 12, junction surface 11 has a larger surface area than junction surface 12, with a thermoelectric generator 62 disposed therebetween accordingly. FIG. 13, which does not show the reduced pressure cell for clarity, illustrates a thermoelectric generator coupled with a photovoltaic cell 64 in a parallel fashion. The junction surface 11 extends over the n-type and p-type material with the radiative area for the thermoelectric generator greater than the area for the photovoltaic cell 64. This embodiment allows for parallel power generation using both the thermoelectric generator and photovoltaic cell, allowing for higher daytime temperature operation of the thermoelectric generator without detrimentally impacting the operation of the photovoltaic cell.

Figure 14:
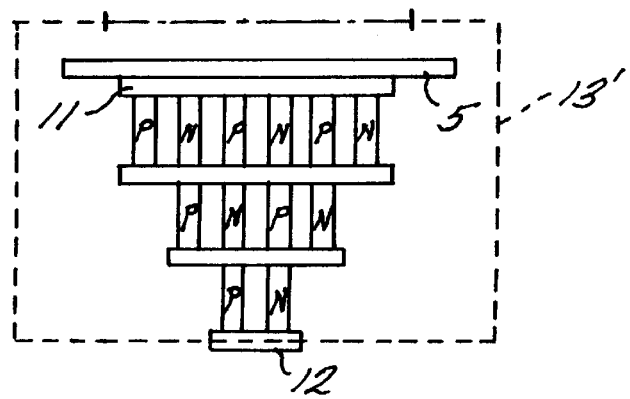
FIG. 14 is a cross sectional view of a cascading thermoelectric generator of the present invention.
Figure 14A:
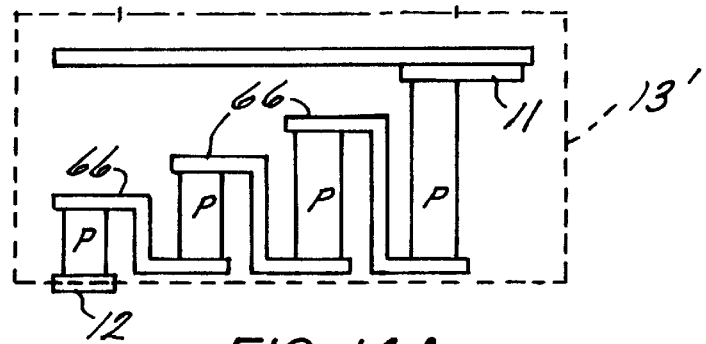
FIG. 14A a cross sectional view of a cascading thermoelectric generator of the present invention.

Referring to FIGS. 14 and 14A, which illustrates a cascaded thermoelectric generator with the larger junction surface 11 exposed to the radiative aperture 60, and an additional, optional radiation heat transfer area 5. The radiation heat transfer area 5 which is another heat transfer plate similar to and thermal conductively connected to junction surface 11, can be sized to increase or decrease the amount of energy radiated external to the cell to improve the overall operation of the electric power generator; e.g. it can be as small as the surface area of the small junction surface or as large as the aperture opening to provide the greatest flexibility of area variation to control the energy that the module can exchange radiatively through the aperture 60. Sizing of the radiation heat transfer area can be a ratio (larger or smaller) than the cross-sectional area of the sum of the thermoelectric generator elements in a single tier or of the other surface area exposed thermally to the exterior of the reduced pressure cell. As with the junction surface, the radiative heat transfer area can be a thermally conductive material including metals such as copper, aluminum, combinations thereof and others.

The use of the cascading arrangement increases the length of the thermoelectric generator elements and the thermal resistance of the module, thereby allowing increased power output. The performance of the thermoelectric generator is dependant on the temperature differential across the module. By increasing the length of the module p-n materials, the temperature differential increases. This length increase can be used to optimize (maximize) the power output from the unit. Increasing the length of the p-n material can result from unique cascading designs as shown in various embodiments of this patent. Numerous other geometries can also be used to increase the thermal resistance of the p-type and n-type materials, including a coiled or curved geometry; a long, slender geometry, unique cascading, element snaking, and element stacking geometry, among others and combinations thereof, as well as various p-type and n-type material orientations, including, but not limited to, parallel, perpendicular, 30°, 45°, 60°, 90°, 180°, or some other angle.

Figure 15:
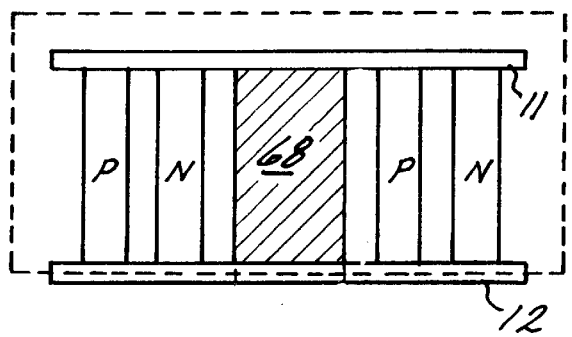
FIG. 15 is a cross sectional view of a thermoelectric generator of the present invention where the geometry and size of the p-type and n-type materials are adjusted to increase thermal resistance and improve power output.

For example, FIG. 15 illustrates long, slender p-type 15 and n-type 14 materials used in conjunction with a mechanical support 68 for providing structural integrity to the materials 14, 15, wherein the ratio of the length of the p-type 15 and n-type 14 materials to the area thereof is preferably about 4 or greater, with about 5 or greater especially preferred. The mechanical support 68 employed herein, which can be a single or multiple sectioned support and which is preferably additionally a thermal and electrical insulator, enables static support of the junction surfaces 11, 12, as well as for dynamic applications of the reduced pressure vessel, and improved structural integrity of the p-type 15 and n-type 14 materials. Possible mechanical supports 68 can be composed of a thermally insulating material capable of maintaining the distance between the junction surfaces 11, 12. The size and geometry of the mechanical support 68 should be sufficient to provide the necessary structural integrity to the p-type 15 and n-type 14 materials.

Figure 16A:
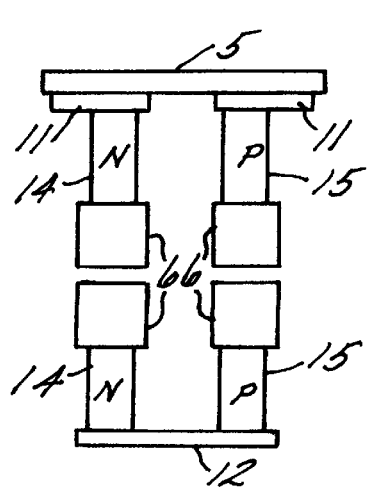
FIG. 16A is a cross sectional view of section AA from FIG. 16 which illustrates the orientation of the p-type materials with respect to the n-type materials.
Figure 16:
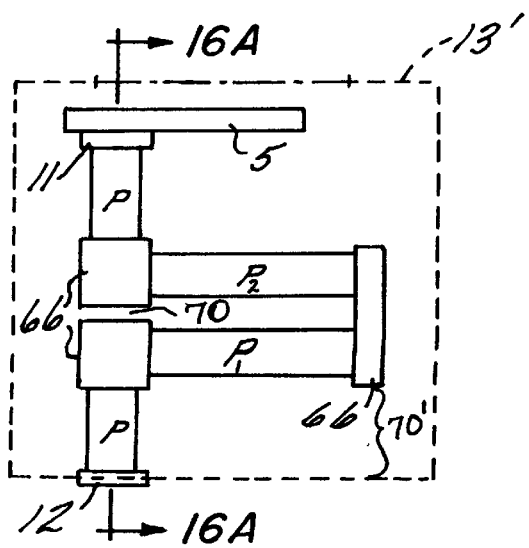
FIG. 16 is a cross sectional view of a thermoelectric generator of the present invention which employs metallic conductors to enable an increase in the length of the p-type and n-type materials.

FIG. 16 illustrates that the length of the p-n elements can be extended significantly when put into the reduced pressure vessel. In this embodiment, the thermal conductors 66, which are typically composed of a metallic or semiconductor material, are transition pieces which allow the semiconductor materials to be installed in a perpendicular orientation (or some other angle) to the original p-n material. In this way, several "layers" of p-n material can be added without increasing the distance between the hot and cold junctions of the module, while at the same time increasing the thermal resistance of the module. Since the temperature differences between the different material sections are small enough and due to the employment of the reduced pressure vessel, the mode of heat transfer, radiation, between the material sections is rendered insignificant. Consequently, such an arrangement of p-n materials is possible without adversely effecting the power output of the system.

Furthermore, since matching the temperature differential to the operating range of the p-type and n-type material improves output of the p-n junction, as is shown in FIG. 16 ($p_1$ and $p_2$), the p-type and n-type materials can be selected for the different "legs" of the layers that operate in a temperature range that is best suited for the temperature differential which that particular material will experience in that portion of the unit.

It should be noted that the increased thermal resistance provided by a design such as in FIG. 16, can eliminate, for certain applications, the need for the reduced pressure cell. Although the vacuum pod or cell provides the ideal environment for insulation between the stacked or layered p-n materials, under certain conditions the layered module can operate without the benefit of the vacuum. For example, in a system operating in the 400° K to 600° K temperature range, although not limited to this range, atmospheric air (or some other gas) could provide adequate insulation between layers. Radiative heat transfer effects would be negligible in this low temperature range and the system would function well. Air circulation through the module would also improve performance. Even a mechanical insulation could be provided to ensure heat transfer through the p-n materials and not between the material stacks. In certain applications the vacuum cell may not be rugged enough to maintain the vacuum. Therefore, this particular embodiment of the present patent applies.

FIG. 16 also shows an embodiment of the invention where surface 5 can be connected thermally to the surroundings by conduction heat transfer, eliminating the need for a window or aperture. Again this is one of the many configurations allowed by the flexibility of the present invention.

Figure 16B:
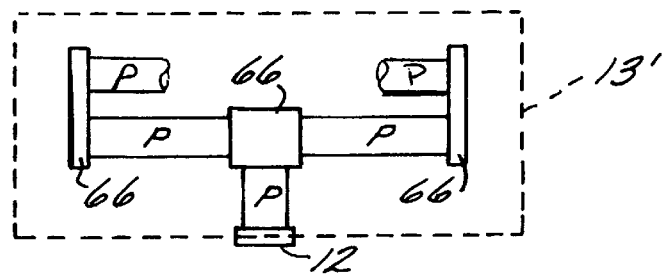
FIG. 16B a cross sectional view of a thermoelectric generator of the present invention which illustrates another orientation scheme using a p-type/n-type material arrangement as in FIG. 16A.

FIG. 16A illustrates one simple scheme of how the p-type 15 and n-type 14 materials can be oriented with respect to one-another and the thermal conductors 66. Meanwhile, FIG. 16B illustrates another orientation scheme using the reduced pressure vessel 13' where the length of the p-type 15 and n-type 14 materials can be extended significantly using thermal conductors 66 to transition the materials. Numerous other orientations can be envisioned and are within the scope of the present invention. For example, in FIG. 16B the initial vertical p-type material up to the thermal conductor 66 could have a cross-sectional area twice that of the two perpendicular p-type materials to maintain balanced thermal and electrical energy flows. Furthermore, as with other of these designs, several "layers" of p-type and n-type material can be added to form an array. It should be noted that in addition to the thermal conductors 66, insulators can also be employed, such as in area 70, to improve mechanical integrity.

In addition to geometry alternatives, the metallic conductors increase the thermal resistance, providing a greater temperature differential for the module to operate in, thereby increasing the power output. Consequently, the metallic conductors should be capable of increasing thermal resistance without adversely affecting the electrical properties at the electrical connections between the p-n material and the metallic conductors. Possible metallic conductors include copper, gold, aluminum, and silver, among others.

Embodiments employing metallic conductors are illustrated in FIGS. 14A, 16, 16A, and 16B. In FIG. 14A, which is a variation of the cascading illustrated in FIG. 14, thermal conductors 66 connect similar materials (e.g. p-type materials).

Design of the thermoelectric generator focuses upon obtaining a stable, maximum temperature differential in the operating range of the thermoelectric generator. Factors effecting the design of the module include the thermal conductivity and geometric specifications of cross-sectional area, and length of the p-type and n-type material elements. The geometry, in conjunction with the thermal conductivity, influence the thermal resistance of each element, which, in turn, determines the temperature differential between the hot and cold junctions.

Figure 17:
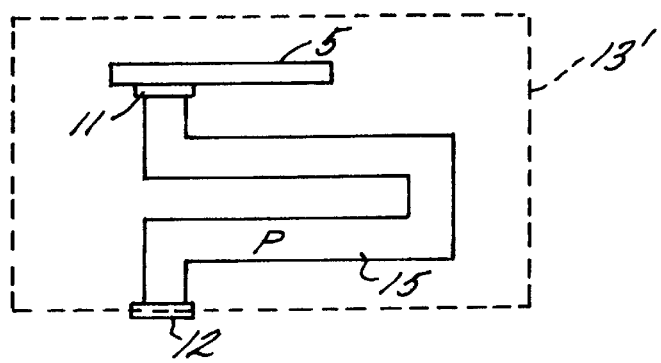
FIG. 17 is a cross sectional view of a thermoelectric generator of the present invention employing another geometry which snakes the p-type and n-type materials to increase their length.

Alternatively, as is illustrated in FIG. 17, the semiconductor material (p-type material) can be a continuous medium without metallic conductors to interrupt the perpendicular transition. Here the p-n materials "snake" the full distance from the hot junction to the cold junction (or vice versa) such that the thermal resistance is entailed throughout the entire semiconductor material. The added material can be utilized to increase the electrical power output of the module. Mechanical support of the snaked legs of the p-n material can be added to improve the structural integrity of the module.

Optionally, the p-n element could be drawn through a wire die (or by some other means) to manufacture the thermoelectric generator elements as a long thin wire. Coating the wire with insulation, then coiling the element into a small mass to fit into the vacuum pod would improve both thermal and electrical properties and characteristics of the module.

Figure 18:
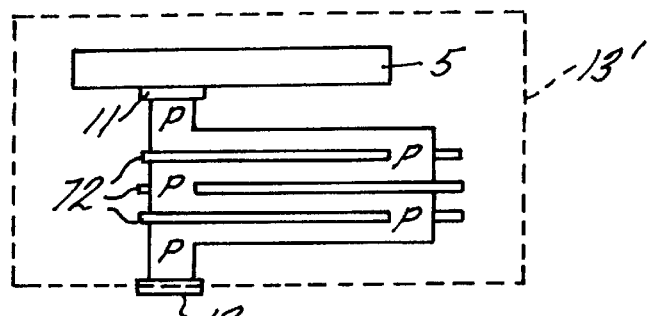
FIG. 18 is a cross sectional view of a thermoelectric generator of the present invention employing thin film insulators to enable condensed snaking of the p-type and n-type materials to optimize usage of space.

In FIG. 18, the p-type and n-type materials reside on thin film insulators 72 which enable the construction of light weight modules. In this embodiment, thin film technology is employed to manufacture the p-type and n-type materials by the deposition of the semiconductor on thin film insulators that can be installed into the reduced pressure cell. This enables further snaking the p-n elements, laterally, longitudinally and otherwise, to increase the thermal resistance of the system and improve the cross-sectional area of the semiconductor material, hence improving the power generating capabilities of the vacuum pod. Various types of thin film insulators can be employed, such as those having sufficient thermal insulation to inhibit adverse thermal effects between the elements. Possible insulators include glass, ceramic, thermoplastics, and thermoset materials, among others, combinations and composites thereof. The thickness of these films should be sufficient to attain the desired insulating effects, with a thickness up to about 30 mils or greater typically sufficient, below about 20 mils preferred, and up to about 10 mils especially preferred.

Figure 19:
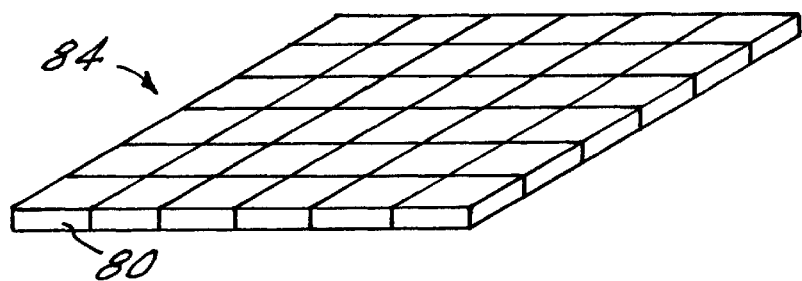
FIG. 19 is an isometric view of an array incorporating cells of the present invention where the cells are in individual reduced pressure units arranged in an array.

FIG. 19 shows individual reduced pressure units 80 ganged into an array 84 to improve the power producing capability of the units and produce the electrical output characteristics desired. These units can be designed to have side-by-side plug-in assemblies with series or parallel electrical connections as well as end-to-end plug-in assemblies, e.g. similar to Lego™ or Erector Set™ modules with plug-in capabilities. The vacuum pods could also have electrical connections that come out of the bottom to assemble the modules on a buss or can be manufactured as a gang of units that are connected electrically and evacuated as a single unit but sealed as individual cells. Again, there is no restriction on the size of the vacuum pod or the number of modules inside. Consequently, various units can be connected electrically to produce a desired voltage and current as required for the application of the power generating unit. In practice, to ensure that a majority of the vacuum pods maintain their vacuum, hence their maximum power producing capability, smaller pods, interconnected electrically but isolated mechanically (i.e., small chambers), are desirable. Therefore the unit shown in FIG. 19 can have individual chambers for vacuum purposes but be interconnected electrically. Obviously the vacuum chamber can be as large as desired.

Figure 20:
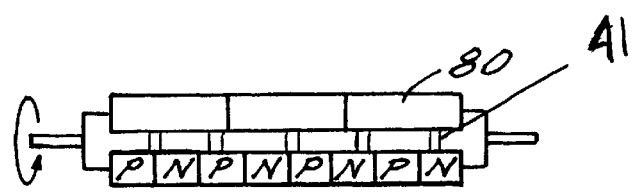
FIG. 20 is a cross sectional view of a thermoelectric-photovoltaic cell of the present invention which illustrates daytime and nighttime operation of the cell.

FIG. 20 demonstrates an embodiment of the present invention as part of an assembly to increase the power producing capability of an area dedicated to producing power from a renewable source. Daytime utilization of the area produces electrical energy from a solar panel, with or without thermoelectric generators as part of the energy producing medium. For nighttime utilization of the area, the panel is rotated to expose the opposite side of the panel to the nighttime sky and produce electrical energy from the vacuum pods with thermoelectric generators. In this way, more of the available energy producing area can use the thermoelectric generators exclusively at night when the photovoltaic cells are ineffective. There are many schemes that can be incorporated in combining the cells back-to-back in this mode to allow the circulation of air, water, or other fluids of thermal capability (cooling or heating) to augment and enhance the power producing capability of the panel.

Referring next to FIGS. 6 and 7 there is illustrated an array of the thermoelectric-photovoltaic device of the present invention. In this embodiment there are included support rails 45 fixedly attached to array 8. This embodiment is particularly suited for electrical power generation in connection with a device in a low-earth orbit. With the support rail disposed as illustrated the array would be oriented such that surface junction 12 would be the hot junction and junction surface 11 would be the cold junction. Because the ambient atmosphere of space has a reduced atmosphere, this embodiment would not require the reduced pressure cell. A similar support structure could be envisioned for mounting the array from the opposite side.

Figure 8:
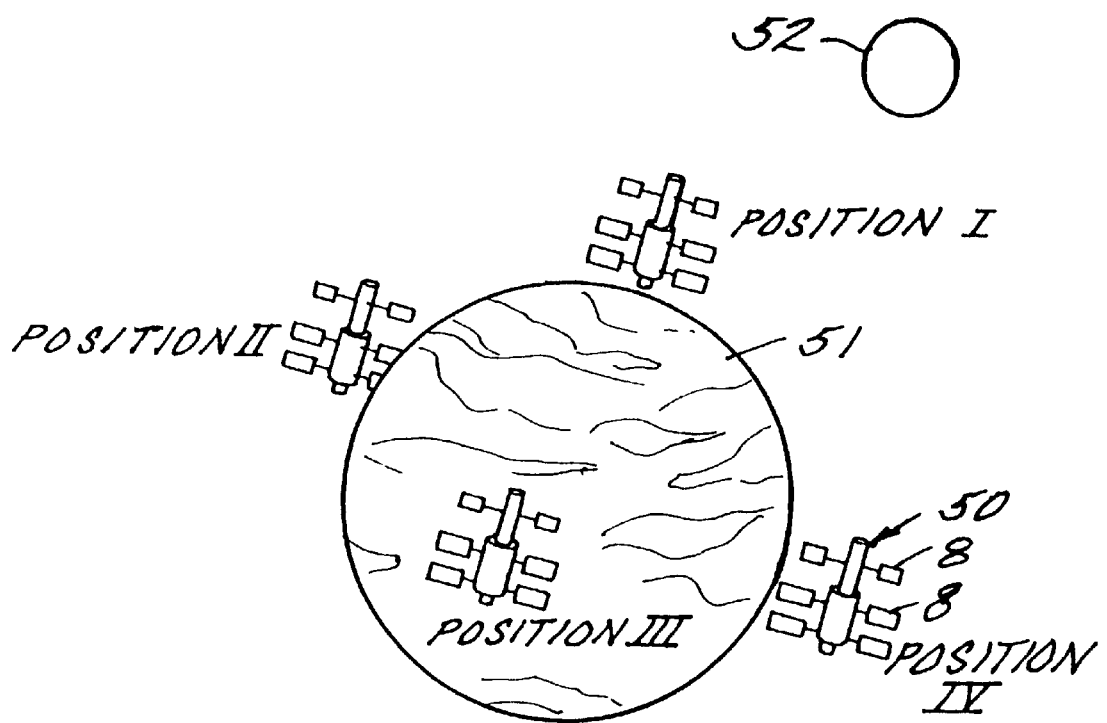
FIG. 8 is a perspective illustration of a satellite incorporating a thermoelectric-photovoltaic cell of the present invention.

Referring finally to FIG. 8 there is illustrated a satellite 50 employing an embodiment of the present invention. Satellite 50 is illustrated in a low orbit about earth 51 including panel arrays 8 positioned about its exterior. The array panels are oriented such that there is always a hot side of the array and a cold side of the array. For example at position I as depicted in FIG. 8 the hot side of the thermoelectric generator and the photovoltaic cells are facing the sun 52. In position I the thermoelectric-photovoltaic array is producing electrical energy to power the satellite from both the thermoelectric generator as well as the photovoltaic cells. In positions II and IV a portion of arrays 8 are shadowed by the earth and a portion are in direct sunlight. In these positions the photovoltaic cells in sunlight are producing energy while the photovoltaic cells in the shadow of the earth are not. At the same time the thermoelectric generators in sunlight are producing energy by absorbing solar radiation and emitting heat to the ambient atmosphere while the thermoelectric generators in the shadow of the earth are absorbing heat from the ambient atmosphere and emitting heat to black sky. In position III all of the arrays are in the shadow of the earth while the backside of the arrays are facing deep space. In this position the photovoltaic cells are not functioning to produce energy. The thermoelectric generators are producing electrical energy by absorbing heat from the ambient atmosphere and emitting heat to deep space.

The thermoelectric-photovoltaic device of the present invention solves many of the problems of the prior art. In a terrestrial setting during nighttime conditions the reduced pressure cells surrounding the cold junction surfaces of the thermoelectric generator enhance the heat transfer relationship between the device and the black sky thereby increasing the effectiveness of the device and utilizing the surface area of the device to produce energy at night. During daylight terrestrial operation the device combines photovoltaic cells with thermoelectric generator cells in a staged fashion such that the full surface area of the cell is exposed to sunlight and thermal energy to produce electrical energy. By contrast U.S. Pat. No. 4,710,588 discloses a solar cell in combination with a thermoelectric generator in a series fashion. Because of the series arrangement of the elements the thermoelectric generator cannot effectively absorb thermal energy from the sun during daylight conditions and cannot effectively emit heat to black sky at night. In addition, the basic design of the current invention takes advantage of current state of the art manufacturing techniques using thin film and/or transparent electrical connectors with thin film semiconductor materials.

The embodiments of the present invention set forth feature basic p-type material and n-type material junctions. Embodiments of the inventions do include other configurations including cascading or staging of the materials to improve the efficiency. In addition, the particular type of material for various embodiments includes those known in the art as well as those yet to be developed. For example, most photovoltaic cells in use today employ monocrystalline and polycrystalline silicon. However, more expensive compound semiconductors such as GaAs, InP, and CdTe as well as various ternary and quaternary compounds such as AlGaAs or GaAsInP have shown promise for photovoltaic cell applications. With respect to materials for the manufacture of thermoelectric generators materials such as $Bi_2Te_3$, PbTe, or PbSnTe, among others and mixtures and alloys thereof, are quite suitable.

The thermoelectric-photovoltaic units of the present invention can employ a reduced pressure cell around part or the entire thermoelectric-photovoltaic unit. The reduced pressure cell insulates the cold junction from the ambient temperature, providing excellent insulation of the cold junction from the surroundings, while at the same time, allowing the cold junction to "see" the black sky and exchange energy with it by radiation heat transfer. Similarly, during daytime operation of the system, the reduced pressure cell insulates the hot junction of the module, now heated by the sun, from the cool ambient air, improving the power generating capability of the module.

The present invention further improves the performance (increases the electrical power output) of the unit by adjusting the geometry and/or size of the p-type and n-type materials to increase their thermal conductive resistivity. For example, the materials of the present invention have a preferred length to cross-sectional area ratio of about 4 or greater, with about 5 or greater especially preferred. At these ratios, it may be preferable to employ support to improve structural integrity of the materials. Consequently, supports can be employed, such as disposing insulation columns parallel to the individual thermoelectric elements to improve rigidity and cell durability, while not providing a thermal link between the two junctions.

Performance improvement is also realized. In one preferred embodiment, various configurations of thermoelectric generator cascading can be utilized to improve overall cell performance when compared to a single row of elements which has no cascading. The thermoelectric generator cascading then provides the element area ratio with the radiative area that includes a factor or constant that improves the thermal resistance. Increasing the thermal resistance of the p-n materials increases the temperature differential between the hot and cold junctions of the thermoelectric generators, improving the thermoelectric generator's power producing capability. This can also be accomplished utilizing unique cascading schemes that increase the length of the p-n elements. Alternatively, lengthening the thermal path can be accomplished by introducing horizontal (or some other angle) flow paths of the thermoelectric generator elements with offset hot and cold plates. The elements can be snaked up and down or back and forth for a series of convolutions to increase the thermal resistance between the hot and cold junctions of any pair. If the increased length takes place in the horizontal direction, many more embodiments of the patent can be envisioned. It should be noted that increased thermal path, while increasing the temperature differential, does affect electrical performance of the module. By controlling the thermal path, however, more options are available for geometric design to improve electrical output.

As has been previously stated, performance of a thermoelectric generator is a function of temperature differential and the stability thereof. The present invention employs stable thermal sinks and sources, for example, the black sky and the surrounding air, with other sources and sinks possible. With respect to the temperature differential, a maximum temperature differential in the operating range of the p-type and n-type materials is preferred. The units are designed to enable a controlled temperature drop which will determine the temperature differential.

Figure 22:
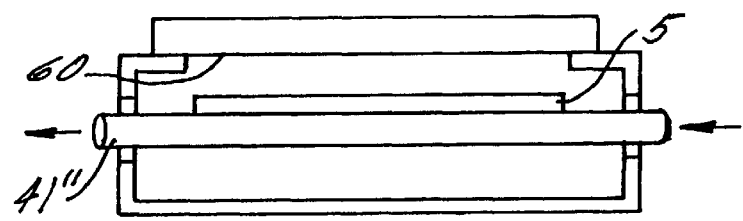
FIG. 22 is a cross sectional view of a cell of the present invention employing alternate internal heat transfer augmentation.

A further advantage of the present invention is that the unit is capable of radiating thermal energy from any standard thermodynamic cycle into deep space, thus "dumping" waste energy away from the environment of the earth into outer space. For example, in a large power plant that operates on the Rankine Cycle, there is a large amount of waste thermal energy that enters the environment. This is such a large amount of energy (on the order of 100's of kilowatts) that the pod array may be too large to be practical. But in rural applications where stirling cycle engines can pump water for domestic use or irrigation, the vacuum pod may be usable. The vacuum pod could lower the overall operating temperature of the unit and/or improve cycle efficiency. This embodiment of the present invention is shown in FIG. 22.

Yet another advantage relates to the parallel operation of the device. Increased operating temperature of the photovoltaic cell reduces the performance, hence the power producing capability, of the device. In the series operation of the prior art device, the photovoltaic cell must become very hot for the thermoelectric generator to perform adequately. The higher the operating temperature differential of the thermoelectric generator, the better the performance. However, this high operating temperature is detrimental to the performance of the photovoltaic cell. To prevent the photovoltaic cell from becoming too warm, the operating temperature of the thermoelectric generator must be reduced, to maintain good performance of the photovoltaic cell, therefore, there are two opposing physical phenomena that must be balanced to try to operate the device. In the present invention, these two physical phenomena can be optimized for maximum performance of the photovoltaic cell as well as the thermoelectric generator. Referring to FIG. 9, for example, the P-N element in the center of the device is the photovoltaic cell 30' which is thermally insulated from the surrounding thermoelectric generator. Therefore, in this embodiment, the photovoltaic cell 30' and the thermoelectric generator are insulated from each other to enhance performance. To further improve the efficiency of the photovoltaic cell 30', it may optionally be connected to the cold junction surface, shown as junction surface 12, via a thermal connector 2.

Furthermore, the surface of junction 11 can be designed to maximize the temperature of the junction, independent of the temperature of the photovoltaic cell. In a low earth orbit application, while facing the sun, the combined parallel operation of the thermoelectric generator and photovoltaic cell produces a higher density of charge carriers, hence an increased flow of electrical current, for operating the electrical devices on the satellite, without the thermal restriction placed on the device by prior art designs.

It should be noted that the perpendicular orientation or horizontal assembly of thermoelectric generator p-type and n-type materials, as well as the "snaking" of the p-type and n-type materials, is not restricted to the unique design utilized and taught herein. The technique of perpendicular elements and of "stacking" of p-type and n-type materials of different thermal and electrical properties to better match the natural temperature range differentials that will occur, can be used in any module construction, improving the power generating performance of the unit tremendously.

The energy generating device of the present invention teaches: (1) using the reduced pressure cell to improve thermal insulation between the thermoelectric generators and the photovoltaic cells as well as between the various p-n elements of the thermoelectric generators and their hot and cold junctions as well as the p-n elements with the surroundings and/or the ambient; (2) the area ratios between the hot and cold junction plates as well as the thermoelectric generator element areas can be augmented to improve system performance; (3) various cascading schemes and module designs (including lengthening of the thermoelectric generator elements) to improve temperature differentials between the hot and cold junctions, improving the power producing capability of the vacuum pods; (4) improved overall strength between the hot and cold junction support plates, allowing for thinner, longer p-n elements; (5) perpendicular or parallel (or any other angle) p-n elements with added length to improve power generating capabilities; (6) manufacturing the configuration of the p-n elements in a fashion that allows "snaking" of the elements to increase temperature differentials; (7) using thin film and thin film semiconductor materials, for the thermoelectric generator's capability of increased temperature differential operation; (8) the combination of a power panel with the vacuum pod array construction back-to-back with a photovoltaic cell array will increase significantly the electrical power output of a given panel area, tremendously improving the state of the art of electrical energy production possible from a given area; (9) the improved spectral properties of the aperture window to enhance the operation of the vacuum pod.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. An electricity generating device for use in an environment having an ambient pressure, using an electricity generating cell comprising:

a first junction surface disposed in contact with a first semiconductor material;

a second junction surface disposed in contact with a second semiconductor material;

a third junction surface disposed in contact with the first semiconductor material and the second semiconductor material;

the first and second junction surfaces disposed within a pressure cell having a pressure less than the ambient pressure; and the first and second junction surfaces at a temperature different from the third surface junction producing a thermoelectric potential between the first and second junction surfaces.

2. An electricity generating device as set forth in claim 1, further comprising heat augmentation disposed in thermal communication with the third junction surface.

3. An electricity generating device as set forth in claim 1, wherein the first and second junction surfaces are at about the same temperature and the third junction surface at a greater temperature.

4. An electricity generating device as set forth in claim 1, wherein the first and second junction surfaces are at about the same temperature and the third junction surface is at a lesser temperature.

5. An electricity generating device as set forth in claim 1, wherein the first and second junction surfaces are at different temperatures.

6. An electricity generating device as set forth in claim 1, wherein
the electricity generating cell has a thermal resistivity;
the first semiconductor material is disposed in a distance between the first junction surface and the third junction surface; and
the first semiconductor material has a geometry which increases said thermal resistivity as compared to a second electricity generating cell having a first semiconductor material having a straight geometry which spans a substantially equivalent distance.

7. An electricity generating device as set forth in claim 6, wherein said geometry is curved, coiled, snaking, or a combination thereof.

8. An electricity generating device as set forth in claim 6, further comprising at least one first film insulator disposed adjacent to and in contact with said first semiconductor material.

9. An electricity generating device as set forth in claim 8, further comprising at at least one second film insulator disposed adjacent to and in contact with said second semiconductor material.

10. An electricity generating device as set forth in claim 1, further comprising a plurality of first semiconductor materials and a plurality of second semiconductor materials oriented in a cascading arrangement.

11. An electricity generating device as set forth in claim 10, further comprising thermal conductors connecting successive rows of said first semiconductor materials and said second semiconductor materials.

12. An electricity generating device as set forth in claim 11, wherein said thermal conductors are metallic materials or semiconductor materials.

13. An electricity generating device as set forth in claim 1, wherein said first semiconductor material is oriented at a first angle between said first surface junction and said third surface junction, and said second semiconductor material is oriented at a second angle between said second surface junction and said third surface junction; and wherein said first and second angles are 30°, 45°, 60°, 90°, or 180°.

14. An electricity generating device as set forth in claim 1, wherein said first material has a length and a cross-sectional area, wherein said length is greater than said cross-sectional area.

15. An electricity generating device as set forth in claim 14, wherein a ratio of said length to said cross-sectional area is at least about 4.

16. An electricity generating device as set forth in claim 14, wherein a ratio of said length to said cross-sectional area is at least about 5.

17. An electricity generating device as set forth in claim 14, further comprising a mechanical support disposed between said first surface junction and said third surface junction.

18. An electricity generating device as set forth in claim 17, further comprising a mechanical support disposed between said second surface junction and said third surface junction.

19. An electricity generating device as set forth in claim 1, wherein said first semiconductor material and said second semiconductor material are disposed within said pressure cell.

20. An electricity generating device as set forth in claim 19, wherein said third junction surface is disposed within said pressure cell.

21. An electricity generating device as set forth in claim 20, further comprising first heat augmentation disposed in thermal communication with the third junction surface.

22. An electricity generating device as set forth in claim 21, further comprising second heat augmentation disposed in thermal communication with said pressure cell.

23. An electricity generating device as set forth in claim 19, further comprising
the thermoelectric potential having an electrical current;
the first and second junction surfaces electrically connected such that the current flows to a current flow direction circuitry;
the current flow direction circuitry operable to detect the direction of the current;
the current flow direction circuitry further operable to orient the direction of an output current; and
the current flow circuitry electrically connected to a load.

24. An electricity generating device as set forth in claim 1, further comprising
the thermoelectric potential having an electrical current;
the first and second junction surfaces electrically connected such that the current flows to a current flow direction circuitry;
the current flow direction circuitry operable to detect the direction of the current;
the current flow direction circuitry further operable to orient the direction of an output current; and
the current flow circuitry electrically connected to a load.

25. An electricity generating device as set forth in claim 1, further comprising a mechanical support disposed between said first junction surface and said third junction surface.

26. An electricity generating device as set forth in claim 1, further comprising heat augmentation disposed in thermal communication with said pressure cell.

27. An electricity generating device as set forth in claim 26, wherein said heat augmentation is a finned heat exchanger, fluid heat exchange, baffled heat exchanger, radiation shield, heat transfer composition, or a combination thereof.

28. An electricity generating device as set forth in claim 1, further comprising heat augmentation disposed in thermal communication with the first junction surface.

29. An electricity generating device as set forth in claim 1, further comprising a heat exchanger disposed in heat exchange communication with the second junction surface.

30. An electricity generating device as set forth in claim 1, further comprising a first radiation heat transfer area disposed in thermal communication with said first junction surface.

31. An electricity generating device as set forth in claim 30, wherein said radiation heat transfer area is disposed in thermal communication with said second junction surface.

32. An electricity generating device as set forth in claim 1, further comprising a plurality of electricity generating cells electrically connected together.

33. An electricity generating device as set forth in claim 32, wherein the first and second junction surfaces of said plurality of electricity generating cells is at least partially disposed within a single pressure cell.

34. An electricity generating device as set forth in claim 32, wherein each of the electricity generating cells is at least partially disposed within separate pressure cells.

35. An electricity generating device as set forth in claim 32, wherein the plurality of electricity generating cells are connected in series fashion.

36. An electricity generating device as set forth in claim 32, wherein the plurality of electricity generating cells are connected in parallel fashion.

37. An electricity generating device as set forth in claim 1, further comprising a photovoltaic cell disposed within the electricity generating cell, the photovoltaic cell comprising a third semiconductor material and a fourth semiconductor material, the third and fourth semiconductor materials converting sunlight to electrical energy.

38. An electricity generating device as set forth in claim 37, wherein the fourth semiconductor material is the first semiconductor material.

39. An electricity generating device as set forth in claim 37, wherein the photovoltaic cell includes a light concentrating device for focusing sunlight onto the third and fourth semiconductor materials.

40. An electricity generating device as set forth in claim 37, further comprising a plurality of electricity generating cells and a plurality of photovoltaic cells electrically connected together.

41. An electricity generating device as set forth in claim 40, wherein the first and second junction surfaces of said plurality of electricity generating cells are disposed within a single pressure cell.

42. An electricity generating device as set forth in claim 40, wherein the first and second junction surfaces of each of said plurality of electricity generating cells are disposed within separate pressure cells.

43. An electricity generating device as set forth in claim 40, wherein the plurality of electricity generating cells are connected in series fashion to said plurality of photovoltaic cells.

44. An electricity generating device as set forth in claim 40, wherein the plurality of electricity generating cells are connected in parallel fashion to said plurality of photovoltaic cells.

45. An electricity generating device as set forth in claim 37, wherein the first semiconductor material, second semiconductor material, third semiconductor material, and fourth semiconductor material are chosen based upon the thermal characteristics of that portion of the device.

46. An electricity generating device as set forth in claim 37, wherein the electricity generating cell is connected in series fashion to the photovoltaic cell.

47. An electricity generating device as set forth in claim 37, wherein the electricity generating cell is connected in parallel fashion to the photovoltaic cell.

48. An electricity generating device as set forth in claim 1, wherein at least a portion of said pressure cell is capable of transmitting sunlight to the photovoltaic cell.

49. An electricity generating device as set forth in claim 48, wherein the portion of said pressure cell capable of transmitting sunlight has a reflectivity coating.

50. An electricity generating device as set forth in claim 1, wherein said first material has a length and a cross-sectional area, wherein said length is greater than said cross-sectional area.

51. An electricity generating device as set forth in claim 50, wherein a ratio of said length to said cross-sectional area is at least about 4.

52. An electricity generating device as set forth in claim 50, wherein a ratio of said length to said cross-sectional area is at least about 5.

53. An electricity generating device as set forth in claim 50, further comprising a mechanical support disposed between said first surface junction and said third surface junction.

54. An electricity generating device as set forth in claim 53, further comprising a mechanical support disposed between said second surface junction and said third surface junction.

55. An electricity generating device as set forth in claim 50, further comprising
the thermoelectric potential having an electrical current;
the first and second junction surfaces electrically connected such that the current flows to a current flow direction circuitry;
the current flow direction circuitry operable to detect the direction of the current;
the current flow direction circuitry further operable to orient the direction of an output current; and
the current flow circuitry electrically connected to a load.

56. An electricity generating device as set forth in claim 1, further comprising a photovoltaic cell disposed within the electricity generating cell, the photovoltaic cell comprising a third semiconductor material and a fourth semiconductor material, the third and fourth semiconductor materials converting sunlight to electrical energy.

57. An electricity generating device as set forth in claim 56, wherein the photovoltaic cell includes a light concentrating device for focusing sunlight onto the third and the fourth semiconductor materials.

58. An electricity generating device as set forth in claim 56, wherein the fourth semiconductor material is the first semiconductor material.

59. An electricity generating device as set forth in claim 56, further comprising a plurality of electricity generating cells and a plurality of photovoltaic cells electrically connected together.

60. An electricity generating device as set forth in claim 59, wherein the plurality of electricity generating cells are connected in parallel fashion to said plurality of photovoltaic cells.

61. An electricity generating device as set forth in claim 56, wherein the first semiconductor material, second semiconductor material, third semiconductor material, and fourth semiconductor material are chosen based upon the thermal characteristics of that portion of the device.

62. An electricity generating device as set forth in claim 56, wherein the electricity generating cell is connected in parallel fashion to the photovoltaic cell.

63. An electricity generating device using an electricity generating cell having a thermal resistivity, comprising:
a first junction surface disposed in contact with a first semiconductor material;
a second junction surface disposed in contact with a second semiconductor material;
a third junction surface disposed in contact with the first semiconductor material and the second semiconductor material;
the first and second junction surfaces at a temperature different from the third surface junction producing a thermoelectric potential between the first and second junction surfaces;
the first semiconductor material is disposed in a distance between the first junction surface and the third junction surface; and
the first semiconductor material has a geometry which increases said thermal resistivity as compared to a second electricity generating cell having a first semiconductor material having a straight geometry which spans a substantially equivalent distance.

64. An electricity generating device as set forth in claim 63, wherein the first and second junction surfaces are at about the same temperature and the third junction surface at a greater temperature.

65. An electricity generating device as set forth in claim 63, wherein the first and second junction surfaces are at about the same temperature and the third junction surface is at a lesser temperature.

66. An electricity generating device as set forth in claim 63, wherein the first and second junction surfaces are at different temperatures.

67. An electricity generating device as set forth in claim 63, wherein said geometry is curved, coiled, snaking, or a combination thereof.

68. An electricity generating device as set forth in claim 67, further comprising at least one first film insulator disposed adjacent to and in contact with said first semiconductor material.

69. An electricity generating device as set forth in claim 68, further comprising at least one second film insulator disposed adjacent to and in contact with said second semiconductor material.

70. An electricity generating device as set forth in claim 63, further comprising a plurality of first semiconductor materials and a plurality of second semiconductor materials oriented in a cascading arrangement.

71. An electricity generating device as set forth in claim 70, further comprising thermal conductors connecting successive rows of said first materials and said second materials.

72. An electricity generating device as set forth in claim 71, wherein said thermal conductors are metallic materials or semiconductor materials.

73. An electricity generating device as set forth in claim 63, wherein said first semiconductor material is oriented at a first angle between said first surface junction and said third surface junction, and said second semiconductor material is oriented at a second angle between said second surface junction and said third surface junction; and wherein said first and second angles are 30°, 45°, 60°, 90°, or 180°.

74. An electricity generating device as set forth in claim 63, further comprising
the thermoelectric potential having an electrical current;
the first and second junction surfaces electrically connected such that the current flows to a current flow direction circuitry;
the current flow direction circuitry operable to detect the direction of the current;
the current flow direction circuitry further operable to orient the direction of an output current; and
the current flow circuitry electrically connected to a load.

75. An electricity generating device as set forth in claim 63, further comprising a mechanical support disposed between said first junction surface and said third junction surface.

76. An electricity generating device as set forth in claim 63, further comprising heat augmentation disposed in thermal communication with said electricity generating cell.

77. An electricity generating device as set forth in claim 76, wherein said heat exchanger is a finned heat exchanger, fluid heat exchange, baffled heat exchanger, radiation shield, heat transfer composition, or a combination thereof.

78. An electricity generating device as set forth in claim 76, further comprising heat augmentation disposed in thermal communication with the first junction surface.

79. An electricity generating device as set forth in claim 78, further comprising heat augmentation disposed in heat exchange communication with the second junction surface.

80. An electricity generating device as set forth in claim 63, further comprising a first radiation heat transfer area disposed in thermal communication with said first junction surface.

81. An electricity generating device as set forth in claim 63, further comprising a second radiation heat transfer area disposed in contact with said second junction surface.

82. An electricity generating device as set forth in claim 63, further comprising a plurality of electricity generating cells electrically connected together.

83. An electricity generating device as set forth in claim 81, wherein the plurality of electricity generating cells are connected in parallel fashion.

84. A method of converting thermal radiation and sunlight into electrical energy utilizing a device having a full sunlight exposure position, a partial sunlight exposure position, and a full shade position, comprising:
forming the device by electrically connecting, in a parallel fashion, at least one electricity generating cell with at least one photovoltaic cell;
producing electrical energy from both the photovoltaic cell and the electricity generating cell in the full sunlight exposure position; and
producing energy from the electricity generating cell in the full shade position.

85. A method of converting thermal radiation and sunlight into electrical energy as set forth in claim 84, further comprising positioning the device in a low orbit about the earth.

86. A method of converting thermal radiation and sunlight into electrical energy as set forth in claim 84, further comprising positioning the device in a terrestrial setting.

87. A method of converting thermal radiation and sunlight into electrical energy as set forth in claim 84, wherein the electricity generating cell comprises a first junction surface disposed in contact with a first semiconductor material, a second junction surface disposed in contact with a second semiconductor material, a third junction surface disposed in contact with the first semiconductor material and the second semiconductor material, the first and second junction surfaces at a temperature different from the third surface junction producing a thermoelectric potential between the first and second junction surfaces, and the first and second junction surfaces are disposed within a pressure cell having a pressure less than the ambient pressure.

88. A method of converting thermal radiation and sunlight into electrical energy as set forth in claim 84, wherein said device is a thermoelectric-photovoltaic array, the array comprising a plurality of electricity generating cells connected electrically, in a parallel fashion, with a plurality of photovoltaic cells.

89. A method of converting thermal radiation and sunlight into electrical energy as set forth in claim 88, further comprising producing electrical energy from a portion of the photovoltaic cells and from the electricity generating cells in the partial sunlight exposure position.

90. A method of converting thermal radiation and sunlight into electrical energy as set forth in claim 84, further comprising orienting the device such that the thermoelectric cell and the photovoltaic cell are in a perpendicular arrangement with the sunlight throughout the orbit.

91. A method of converting thermal radiation into electrical energy, comprising:
utilizing an energy generating device comprising a first junction surface disposed in contact with a first semiconductor material; a second junction surface disposed in contact with a second semiconductor material; a third junction surface disposed in contact with the first semiconductor material and the second semiconductor material; the first and second junction surfaces at a temperature different from the third surface junction producing a thermoelectric potential between the first and second junction surfaces; the first semiconductor material is disposed in a distance between the first junction surface and the third junction surface; and the first semiconductor material has a geometry which increases said thermal resistivity as compared to a second electricity generating cell having a first semiconductor material having a straight geometry which spans a substantially equivalent distance; and producing electrical energy.

92. A method of converting thermal radiation into electrical energy as set forth in claim 91, further comprising positioning the device in a low orbit about the earth.

93. A method of converting thermal radiation into electrical energy as set forth in claim 91, further comprising positioning the device in a terrestrial setting.

94. A method of converting thermal radiation into electrical energy as set forth in claim 91, wherein said device is a thermoelectric array, the array comprising a plurality of electricity generating cells connected electrically, in a parallel fashion.

95. A method of converting thermal radiation into electrical energy as set forth in claim 91, further comprising using space as a cold sink.

96. A method of converting thermal radiation into electrical energy, comprising:

utilizing an electricity generating cell comprising a first junction surface disposed in contact with a first semiconductor material, a second junction surface disposed in contact with a second semiconductor material, a third junction surface disposed in contact with the first semiconductor material and the second semiconductor material, the first and second junction surfaces at a temperature different from the third surface junction producing a thermoelectric potential between the first and second junction surfaces, and the first and second junction surfaces are disposed within a pressure cell having a pressure less than the ambient pressure; and producing electrical energy.

97. A method of converting thermal radiation into electrical energy as set forth in claim 96, wherein said device is a thermoelectric array, the array comprising a plurality of electricity generating cells connected electrically, in a parallel fashion.

98. A method of converting thermal radiation into electrical energy as set forth in claim 96, further comprising using space as a cold sink.

* * * * *